(12) United States Patent
Kim et al.

(10) Patent No.: US 8,668,847 B2
(45) Date of Patent: Mar. 11, 2014

(54) CONDUCTIVE PASTE AND ELECTRONIC DEVICE AND SOLAR CELL INCLUDING AN ELECTRODE FORMED USING THE CONDUCTIVE PASTE

(75) Inventors: Se-Yun Kim, Seoul (KR); Eun-Sung Lee, Seoul (KR); Sang-Soo Jee, Hwaseong-si (KR); Sang-Mock Lee, Yongin-si (KR)

(73) Assignee: Samsung Electronics Co., Ltd., Gyeonggi Do (KR)

( * ) Notice: Subject to any disclaimer, the term of this patent is extended or adjusted under 35 U.S.C. 154(b) by 50 days.

(21) Appl. No.: 13/208,705

(22) Filed: Aug. 12, 2011

(65) Prior Publication Data

US 2012/0037221 A1    Feb. 16, 2012

(30) Foreign Application Priority Data

Aug. 13, 2010  (KR) .................. 10-2010-0078344
Jul. 6, 2011   (KR) .................. 10-2011-0066739

(51) Int. Cl.
*H01B 1/02* (2006.01)

(52) U.S. Cl.
USPC ........... 252/512; 252/510; 252/513; 252/514; 136/244; 136/256

(58) Field of Classification Search
USPC .............. 252/512–514, 510; 136/244, 256
See application file for complete search history.

(56) References Cited

U.S. PATENT DOCUMENTS

| | | | |
|---|---|---|---|
| 4,962,066 A | 10/1990 | Starz et al. | |
| 5,170,930 A | 12/1992 | Dolbear et al. | |
| 6,027,575 A | 2/2000 | Paruchuri et al. | |
| 6,420,067 B1 | 7/2002 | Yoshioka | |
| 7,056,394 B2 | 6/2006 | Inoue et al. | |
| 7,147,727 B2 | 12/2006 | Kim et al. | |
| 7,399,370 B2 | 7/2008 | Inoue et al. | |
| 2002/0036034 A1 | 3/2002 | Xing et al. | |
| 2004/0245507 A1 | 12/2004 | Nagai et al. | |
| 2005/0019203 A1 | 1/2005 | Saitoh et al. | |

(Continued)

FOREIGN PATENT DOCUMENTS

| EP | 1039568 | 9/2000 |
|---|---|---|
| EP | 2325848 | 5/2011 |

(Continued)

OTHER PUBLICATIONS

Lin et al., "Effect of Ni on glass-forming ability og Cu-Ti-based amorphous alloys", 2006, Transactions of Nonferrous Metals Society of China, 16, pp. 604-606.*

(Continued)

*Primary Examiner* — Khanh Tuan Nguyen (74) *Attorney, Agent, or Firm* — Harness, Dickey & Pierce, P.L.C.

(57) ABSTRACT

A conductive paste including a conductive powder, a metallic glass, and an organic vehicle, wherein the metallic glass includes an alloy of at least two elements selected from an element having a low resistivity, an element which forms a solid solution with the conductive powder, or an element having a high oxidation potential, wherein the element having a low resistivity has a resistivity of less than about 100 microohm-centimeters, and the element having a high oxidation potential has an absolute value of a Gibbs free energy of oxide formation of about 100 kiloJoules per mole or greater.

23 Claims, 5 Drawing Sheets

(56) References Cited

U.S. PATENT DOCUMENTS

| | | | |
|---|---|---|---|
| 2005/0211340 | A1 | 9/2005 | Kim et al. |
| 2006/0102228 | A1 | 5/2006 | Sridharan et al. |
| 2007/0034305 | A1 | 2/2007 | Suh |
| 2007/0072969 | A1 | 3/2007 | Lee et al. |
| 2007/0102676 | A1 | 5/2007 | Lee et al. |
| 2007/0137737 | A1 | 6/2007 | Guo et al. |
| 2007/0157852 | A1 | 7/2007 | Lee et al. |
| 2008/0196794 | A1 | 8/2008 | Blandin et al. |
| 2009/0056798 | A1 | 3/2009 | Merchant et al. |
| 2009/0101190 | A1* | 4/2009 | Salami et al. ............... 136/244 |
| 2009/0211626 | A1 | 8/2009 | Akimoto |
| 2009/0250106 | A1 | 10/2009 | Hayashi et al. |
| 2010/0037990 | A1 | 2/2010 | Suh |
| 2010/0096014 | A1 | 4/2010 | Iida et al. |
| 2010/0098840 | A1 | 4/2010 | Du et al. |
| 2010/0101637 | A1 | 4/2010 | Yamasaki et al. |
| 2011/0114170 | A1 | 5/2011 | Lee et al. |
| 2011/0162687 | A1* | 7/2011 | Moon et al. ............... 136/244 |
| 2012/0031481 | A1 | 2/2012 | Jee et al. |
| 2012/0103409 | A1 | 5/2012 | Kim et al. |

FOREIGN PATENT DOCUMENTS

| | | | |
|---|---|---|---|
| JP | 10040738 | | 2/1998 |
| JP | 10144139 | | 5/1998 |
| JP | 2002298651 | | 10/2002 |
| JP | 2003003246 | | 1/2003 |
| JP | 2004091868 | | 3/2004 |
| JP | 2005050983 | | 2/2005 |
| JP | 2008010527 | | 1/2008 |
| JP | 2009-099371 | A | 5/2009 |
| JP | 2009-138266 | A | 6/2009 |
| JP | 2009197323 | | 9/2009 |
| JP | 2010-018878 | A | 1/2010 |
| JP | 2010133021 | | 6/2010 |
| JP | 20100199196 | | 9/2010 |
| KR | 1020020037772 | A | 5/2002 |
| KR | 1020050087249 | | 8/2005 |
| KR | 1020050096258 | | 10/2005 |
| KR | 100677805 | | 1/2007 |
| KR | 1020070106887 | | 11/2007 |
| WO | WO0131085 | | 5/2001 |
| WO | WO2005096320 | | 10/2005 |
| WO | WO2009108675 | | 9/2009 |
| WO | WO 2010/033281 | * | 3/2010 |

OTHER PUBLICATIONS

Arai, N., et al., Nanocrystal Formation of Metals in Thermally Grown Thin Silicon Dioxide Layer by Ion Implantation and Thermal Diffusion of Implanted Atoms in Heat Treatment, J. Phys. Conf., Ser. 61, 2007; 41-45.
Hilali, M. M. et al., Effect of Ag Particle Size in Thick-Film Ag Paste on the Electrical and Physical Properties of Screen Printed Contacts and Silicon Solar Cells, J. of the Electrochemical Society, 2006, vol. 153: 1; pp. A5-A11.
US Office Action dated Dec. 10, 2012 corresponding to U.S. Appl. No. 13/016,403.
Partial European Search Report for 10190652.7-2102 dated Mar. 23, 2011.
European Search Report for 11177515.1-1218 dated Feb. 5, 2013.
European Search Report dated Dec. 20, 2011.
Wang X et al.: "Atomic structure and glass formig ability of Cu46Zr46A18 bulk metallic glass", J. Appl. Phys. 104, 093519 (2008).
Se Yun Kim et al. "Replacement of oxide glass with metallic glass for Ag screen printing metallization on Si emitter," App. Phys. Lett., Am. Inst. Phys., vol. 98, No. 222112 Jun. 3, 02011).
ASM Handbook. vol. 3 Alloy Phase Diagrams, The Materials Information Soc., Hugh Baker, Ed., ASM International (1992).
Powell et al., Development of metallic glass loaded polymer paste, J. of Materials Processing Tech., 2001, pp. 318-323.
Schubert, G. et al., "Silver thick film contact formation on lowly doped phosphorous emitters", 2005, Proceedings 20th EPVSEC, Barcelona, pp. 934-937.
Kim S J et al: "Silver/metallic glass paste for shallow emitter Si-solar cell", 26th European Photovoltaic Solar Energy Conference and Exhibition, Sep. 5-9, 2011, pp. 492-494, XP009160654.
Lee S-W et al: "Design of a bulk amorphous alloy containing Cu-Zr with simultaneous improvement in glass-forming ability and plasticity", Journal of Materials Research, vol. 22, No. 02, Feb. 2007, pp. 486-492, XP55031306.
Kim Y C et al: "Enhanced glass of forming ability and mechanical properties of new Cu-based bulk metallic glasses", Materials Science and Engineering A: Structural Materials: Properties, Microstructure & Processing, Lausanne, CH, vol. 437, No. 2, Nov. 15, 2006, pp. 248-253, XP027953056.
Neuhaus D-H et al: "Industrial Silicon Wafer Solar Cells", Advance in Optoelectronics, vol. 2007, XP 55031298.
Bashev V F et al: "Crystallization of Al-Ni alloys during rapid cooling", Russian Metallurgy, Allerton Press, Inc, No. 6, 1989, pp. 51-54, XP009160582.
Ivanov E et al: "Synthesis of nickel aluminides by mechanical alloying", Materials Letters, North Holland Publishing Company, Amsterdam, NL, vol. 7, No. 1-2, Aug. 1988, pp. 51-54, XP024149792.
Lim S S et al: "Assessment of the Al-Ag Binary Phase Diagram", Calphad, vol. 19, No. 2, 1995, pp. 131-141, XP55017954.
Wang Q et al: "Cluster line criterion and Cu-Zr-Al bulk metallic glass formation", Materials Science and Engineering A: Structural Materials: Properties, Microstructure & Processing, Lausanne, CH, vol. 449-451, Mar. 19, 2007, pp. 18-23, XP005914563.
Metallurgy Division of the Materials Science and Engineering Laboratory of NIST: "Ag-Cu-Sn System", Aug. 5, 2010, XP55031251, Retrieved from the Internet: http://web.archive.org/web/20100805072225/http://www.metallurgy.nist.gov/phase/solder/agcusn.html.
Oh C-S et al: "A thermodynamic study on the Ag-Sb-Sn system", Journal of alloys and compounds, elsevier sequoia, lausanne, CH, vol. 238, May 1, 1996, pp. 155-166, XP004080478.
Baren M R: "Ag-In (Silver-Indium)" In: White C E T, Okamoto H (Editors): "Phase Diagrams of Indium Alloys and their engineering applications", 1992, ASM International, Materials Park, XP008098250.
Gorshkov N N et al: "Explosive compaction of amorphous Cu-Sn powder prepared by the method of mechanical alloying", Combustion, Explosion, and shock waves, vol. 25, No. 2, 1989, pp. 244-247.
Salkar R A et al: "The sonochemical preparation of amorphous silver nanoparticles", Journal of materials chemistry, vol. 9, No. 6, 1999, pp. 1333-1335.
"Amorphous metal", Wikipedia, Oct. 21, 2010, XP55017848, Retrieved from the internet: URL: http://en.wikipedia.org/w/index.php?title=amorphous_metal&oldid=392080524.
"Electrical resistivity of pure metals" in: "CRC Handbook of chemistry and physics, 77th edition", 1996, CRC Press, Boca raton, New york, London, Tokyo, XP002668350.
NIST, Properties of Lead-Free Solders, Release 4.0, Feb. 2002.
US Office Action dated May 15, 2013 corresponding to U.S. Appl. No. 13/016,403.
US Office Action dated Jun. 5, 2013 corresponding to U.S. Appl. No. 12/943,732.
US Office Action dated Oct. 8, 2013 corresponding to U.S. Appl. No. 13/281,835.
US Office Action dated Aug. 23, 2013 corresponding to U.S. Appl. No. 13/016,403.
US Office Action dated Oct. 23, 2013 corresponding to U.S. Appl. No. 12/943,732.
Don-Ik Lee, et al., "Effect of TRITON™ X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).
Don-Ik Lee, et al., "Plasma Display Material Prepared from a New Blue Phosphor Dispersion" Journal of Applied Polymer Science, vol. 108, 2571-2577 (2008).

(56) References Cited

OTHER PUBLICATIONS

Don-Ik Lee, et al., "Synthesis and Characterization of Triton™ X-based Surfactants with Carboxylic or Amino Groups in the Oxyethylene Chain End", Journal of Applied Polymer Science, vol. 104, 162-170 (2007).

M. Chen, "A Brief overview of bulk metallic glasses", NPG Asia Materials, vol. 3, Step. 2011, pp. 82-90.

Reda, I.M., et al., "Amorphous Cu-Ag Films With High Stability," International Centre for Theoretical Physics, 1982.

* cited by examiner

CONDUCTIVE PASTE AND ELECTRONIC DEVICE AND SOLAR CELL INCLUDING AN ELECTRODE FORMED USING THE CONDUCTIVE PASTE

CROSS-REFERENCE TO RELATED APPLICATION

This application claims priority to Korean Patent Application No. 10-2010-0078344, filed on Aug. 13, 2010, and Korean Patent Application No. 10-2011-0066739, filed on Jul. 6, 2011, and all the benefits accruing therefrom under 35 U.S.C. §119, the content of which in their entirety is herein incorporated by reference.

BACKGROUND

1. Field

This disclosure relates to a conductive paste, and an electronic device and a solar cell including an electrode formed using the conductive paste.

2. Description of the Related Art

A solar cell is a photoelectric conversion device that transforms solar energy into electrical energy. Solar cells have attracted much attention as a potentially infinite and essentially pollution-free next generation energy source.

A solar cell includes p-type and n-type semiconductors. When an electron-hole pair ("EHP") is produced by light absorbed in a photoactive layer of the semiconductors, the solar cell produces electrical energy by transferring electrons and holes to the n-type and p-type semiconductors, respectively, and then collects the electrons and the holes in respective electrodes of the solar cell.

A solar cell desirably has as high efficiency as possible for producing electrical energy from solar energy. In order to improve this efficiency, the solar cell desirably absorbs light with minimal loss, so that it may produce as many electron-hole pairs as possible, and then collect the produced charges without significant loss.

An electrode may be fabricated using a deposition method, which may include a complicated process, have a high cost, and can take a long time. Accordingly, a simplified process, such as screen printing a conductive paste including a conductive material, has been suggested. However, an electrode formed using a conductive paste may have low conductivity because of a glass frit included in a conductive paste. Thus there remains a need for an improved conductive paste.

SUMMARY

An embodiment provides a conductive paste which is capable of improving conductivity of an electrode.

Another embodiment provides an electronic device including an electrode including the fired conductive paste.

Yet another embodiment provides a solar cell including an electrode including the fired conductive paste.

According to an embodiment, disclosed is a conductive paste including a conductive powder, a metallic glass, and an organic vehicle. Herein, the metallic glass includes an alloy of at least two elements selected from an element having a low resistivity, an element which forms a solid solution with the conductive powder, an element having a high oxidation potential, wherein the element having a low resistivity has a resistivity of less than about 100 microohm-centimeters, and the element having a high oxidation potential has an absolute value of a Gibbs free energy of oxide formation of about 100 kiloJoules per mole or greater.

The conductive powder may include a silver, an aluminum, a copper, a nickel or a combination thereof.

The conductive powder may have a size range from about 1 nm to about 50 μm.

The element having a low resistivity may have a resistivity of less than about 15 microohm-centimeters.

The element having a low resistivity may include at least one selected from silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), and strontium (Sr).

The element which forms a solid solution with the conductive powder may have a heat of mixing with the conductive powder of less than 0 kJ/mol.

The element which forms a solid solution with the conductive powder may include at least one selected from lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), ytterbium (Yb), strontium (Sr), europium (Eu), zirconium (Zr), lithium (Li), hafnium (Hf), magnesium (Mg), phosphorus (P), arsenic (As), palladium (Pd), gold (Au), plutonium (Pu), gallium (Ga), germanium (Ge), aluminum (Al), zinc (Zn), antimony (Sb), silicon (Si), tin (Sn), titanium (Ti), cadmium (Cd), indium (In), platinum (Pt), rhodium (Rh), iridium (Ir), uranium (U), nickel (Ni), ruthenium (Ru), technetium (Tc), manganese (Mn), cobalt (Co), tantalum (Ta), niobium (Nb), osmium (Os), vanadium (V), iron (Fe), chromium (Cr), rhenium (Re), molybdenum (Mo), silver (Ag), tungsten (W), beryllium (Be), boron (B), copper (Cu), and mercury (Hg).

The element having a high oxidation potential may include at least one selected from copper, titanium, ruthenium, cadmium, zinc, rhodium, potassium, sodium, nickel, bismuth, tin, barium, germanium, lithium, strontium, magnesium, beryllium, lead, calcium, molybdenum, tungsten, cobalt, indium, silicon, gallium, iron, zirconium, chromium, boron, manganese, aluminum, lanthanum, neodymium, niobium, vanadium, yttrium, and scandium.

The conductive powder, the metallic glass, and the organic vehicle may be included in an amount of about 30 to about 99 weight percent (wt %), about 0.1 to about 20 weight percent (wt %), and about 0.9 to about 69.9 weight percent (wt %), based on the total weight of the conductive paste.

The metallic glass may be substantially amorphous.

The metallic glass may have a supercooled liquid region of about 5° C. to about 200° C.

The metallic glass may include copper (Cu) and zirconium (Zr). In this case, the metallic glass may further include at least one selected from aluminum (Al), silver (Ag), nickel (Ni), titanium (Ti), iron (Fe), palladium (Pd), and hafnium (Hf). At least one selected from aluminum (Al), silver (Ag), nickel (Ni), titanium (Ti), iron (Fe), palladium (Pd), and hafnium (Hf) may be included in an amount of about 10 atomic percent (at %) or less, based on the total amount of the metallic glass.

According to another embodiment, an electronic device includes an electrode formed using the conductive paste.

The electrode may have a contact resistance of about 1 kΩcm$^2$ or less.

The electrode may have a resistivity of about 10 mΩcm or less.

According to another embodiment, a solar cell includes a semiconductor substrate and an electrode electrically connected with the semiconductor substrate and formed using the conductive paste.

The electrode may have a contact resistance of about 1 k$\Omega$cm$^2$ or less.

The electrode may have a resistivity of about 10 m$\Omega$cm or less.

The electrode may include a buffer layer positioned at a region which is adjacent to the semiconductor substrate, and an electrode portion which is positioned at a region except the buffer layer.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Exemplary embodiments will hereinafter be described in further detail with reference to the accompanying drawings, in which various embodiments are shown. This disclosure may, however, be embodied in many different forms and should not be construed as limited to the exemplary embodiments set forth herein.

As used herein, the term "and/or" includes any and all combinations of one or more of the associated listed items. It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "at least one" means a combination comprising one or more of the listed components may be used.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain saturated aliphatic hydrocarbon having 1 to 12 carbon atoms, more specifically 1 to 6 carbon atoms.

Herein, the term 'element' refers to a metal and a semi-metal.

First, disclosed is a conductive paste.

The conductive paste according to an embodiment includes a conductive powder, a metallic glass, and an organic vehicle.

The conductive powder may include at least one metal or alloy selected from a silver (Ag)-containing metal such as silver or a silver alloy, an aluminum (Al)-containing metal such as aluminum or an aluminum alloy, a copper (Cu)-containing metal such as copper (Cu) or a copper alloy, a nickel (Ni)-containing metal such as nickel (Ni) or a nickel alloy, or a combination thereof. However, the conductive powder is not limited thereto but may include other metals, an additive that is not the metal or alloy.

The conductive powder may have a size (e.g., average largest particle size) ranging from about 1 nanometers (nm) to about 50 micrometers ($\mu$m), specifically about 0.1 $\mu$m to about 40 $\mu$m, specifically about 0.5 $\mu$m to about 40 $\mu$m, more specifically about 1 $\mu$m to about 30 $\mu$m. Particles of the conductive powder may be irregular, or have a spherical, rod-like, or plate-like shape.

The metallic glass includes an alloy having a disordered atomic structure including two or more elements. The metallic glass may be an amorphous metal. The metallic glass may have about 50 to about 100 weight percent ("wt %"), specifically about 70 to about 100 wt %, more specifically about 90 to about 100 wt % amorphous content, based on a total weight of the metallic glass. Because the metallic glass has a low resistivity, and thus is different from an insulating glass such as a silicate, it may be considered to be an electrical conductor at a voltage and a current of a solar cell.

The metallic glass is an alloy of at least two elements selected from an element which has a low resistivity, an element which is capable of forming a solid solution with the conductive powder, an element which has a high oxidation potential. The element which has a low resistivity has a resistivity of less than about 100 microohm-centimeters, and the element which has a high oxidation potential has an absolute value of a Gibbs free energy of oxide formation of about 100 kiloJoules per mole or greater.

The element, which has a low resistivity, may substantially determine the conductivity of the metallic glass. The element having a low resistivity may have a resistivity of about 0.001 to about 90 $\mu\Omega$cm, specifically about 0.01 to about 50 $\mu\Omega$cm. In an embodiment, the element having a low resistivity may have resistivity of less than about 15 $\mu\Omega$cm.

The element having a low resistivity may include, for example, at least one selected from silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), and strontium (Sr).

The element which forms a solid solution with the conductive powder is capable of forming a solid solution with the conductive powder when present in the metallic glass.

When the metallic glass is heated to a temperature which is higher than a glass transition temperature (Tg) of the metallic glass, it may be soft, like glass, and show a liquid-like behavior. Herein, because the metallic glass includes an element which is capable of forming a solid solution with the conductive powder, the conductive powder may diffuse into the softened metallic glass.

For example, when the conductive paste including the metallic glass is disposed on a semiconductor substrate to form an electrode for a solar cell, the metallic glass becomes soft during the heat treatment. In addition, during the heat treatment, particles of the conductive powder form a solid solution with the element which forms a solid solution with the conductive powder when it is included in the metallic glass, and thus the particles of the conductive powder diffuse into the softened metallic glass.

Finally, the particles of the conductive powder may diffuse into the semiconductor substrate through the softened metallic glass when the element which forms a solid solution with the conductive powder is present. Accordingly, after cooling, crystallized particles of the conductive powder are produced at or near the surface of the semiconductor substrate in a large amount. In this way, the crystallized particles of the conductive powder formed at or near the surface of the semiconductor substrate may improve the transfer of charges produced in the semiconductor substrate by solar cell, thereby improving efficiency of the solar cell.

The element which is capable of forming a solid solution with a conductive powder may be selected from elements having a heat of mixing ("Hm") of less than 0 kiloJoules per mole (kJ/mol), specifically less than −0.1 kJ/mol, more specifically less than −0.5 kJ/mol with the conductive powder.

For example, when the conductive powder includes silver (Ag), the element which forms a solid solution with the conductive powder may include, for example, lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), ytterbium (Yb), strontium (Sr), europium (Eu), zirconium (Zr), lithium (Li), hafnium (Hf), magnesium (Mg), phosphorus (P), arsenic (As), palladium (Pd), gold (Au), plutonium (Pu), gallium (Ga), germanium (Ge), aluminum (Al), zinc (Zn), antimony (Sb), silicon (Si), tin (Sn), titanium (Ti), cadmium (Cd), indium (In), platinum (Pt), or mercury (Hg). The heat of mixing of representative combinations of an element which forms a solid solution with Ag are listed in the following Table 1.

TABLE 1

| X—Ag | Hm (kJ/mol) | X—Ag | Hm (kJ/mol) | X—Ag | Hm (kJ/mol) |
|---|---|---|---|---|---|
| La—Ag | −30 | Nd—Ag | −29 | Th—Ag | −29 |
| Ce—Ag | −30 | Gd—Ag | −29 | Ca—Ag | −28 |
| Pr—Ag | −30 | Tb—Ag | −29 | Sc—Ag | −28 |
| Pm—Ag | −30 | Dy—Ag | −29 | Ba—Ag | −28 |
| Sm—Ag | −30 | Ho—Ag | −29 | Yb—Ag | −28 |
| Lu—Ag | −30 | Er—Ag | −29 | Sr—Ag | −27 |
| Y—Ag | −29 | Tm—Ag | −29 | Eu—Ag | −27 |
| Zr—Ag | −20 | Au—Ag | −6 | Si—Ag | −3 |
| Li—Ag | −16 | Pu—Ag | −6 | Sn—Ag | −3 |
| Hf—Ag | −13 | Ga—Ag | −5 | Ti—Ag | −2 |
| Mg—Ag | −10 | Ge—Ag | −5 | Cd—Ag | −2 |
| P—Ag | −10 | Al—Ag | −4 | In—Ag | −2 |
| As—Ag | −8 | Zn—Ag | −4 | Pt—Ag | −1 |
| Pd—Ag | −7 | Sb—Ag | −4 | Hg—Ag | −1 |

For example, when the conductive powder includes aluminum (Al), the element which forms a solid solution with the conductive powder may include, for example, palladium (Pd), zirconium (Zr), platinum (Pt), thorium (Th), promethium (Pm), gadolinium (Gd), terbium (Tb), lutetium (Lu), hafnium (Hf), scandium (Sc), yttrium (Y), lanthanum (La), cerium (Ce), praseodymium (Pr), neodymium (Nd), samarium (Sm), dysprosium (Dy), holmium (Ho), erbium (Er), thulium (Tm), plutonium (Pu), rhodium (Rh), titanium (Ti), iridium (Ir), uranium (U), nickel (Ni), gold (Au), ruthenium (Ru), calcium (Ca), technetium (Tc), barium (Ba), ytterbium (Yb), manganese (Mn), cobalt (Co), europium (Eu), tantalum (Ta), strontium (Sr), niobium (Nb), osmium (Os), vanadium (V), phosphorus (P), iron (Fe), chromium (Cr), rhenium (Re), arsenic (As), molybdenum (Mo), lithium (Li), silver (Ag), magnesium (Mg), silicon (Si), germanium (Ge), tungsten (W), or copper (Cu). The heat of mixing of representative combinations of an element which forms a solid solution with Al are listed in the following Table 2.

TABLE 2

| X—Al | Hm (KJ/mol) |
|---|---|
| Pd—Al | −46 |
| Zr—Al | −44 |
| Pt—Al | −44 |
| Th—Al | −40 |
| Pm—Al | −39 |
| Gd—Al | −39 |
| Tb—Al | −39 |
| Lu—Al | −39 |
| Hf—Al | −39 |
| Sc—Al | −38 |
| Y—Al | −38 |
| La—Al | −38 |
| Ce—Al | −38 |
| Pr—Al | −38 |
| Nd—Al | −38 |
| Sm—Al | −38 |
| Dy—Al | −38 |

TABLE 2-continued

| X—Al | Hm (KJ/mol) |
|---|---|
| Ho—Al | −38 |
| Er—Al | −38 |
| Tm—Al | −38 |
| Pu—Al | −33 |
| Rh—Al | −32 |
| Ti—Al | −30 |
| Ir—Al | −30 |
| U—Al | −30 |
| Ni—Al | −22 |
| Au—Al | −22 |
| Ru—Al | −21 |
| Ca—Al | −20 |
| Tc—Al | −20 |
| Ba—Al | −20 |
| Yb—Al | −20 |
| Mn—Al | −19 |
| Co—Al | −19 |
| Eu—Al | −19 |
| Ta—Al | −19 |
| Sr—Al | −18 |
| Nb—Al | −18 |
| Os—Al | −18 |
| V—Al | −16 |
| P—Al | −12 |
| Fe—Al | −11 |
| Cr—Al | −10 |
| Re—Al | −9 |
| As—Al | −6 |
| Mo—Al | −5 |
| Li—Al | −4 |
| Ag—Al | −4 |
| Mg—Al | −2 |
| Si—Al | −2 |
| Ge—Al | −2 |
| W—Al | −2 |
| Cu—Al | −1 |

For example, when the conductive powder includes copper (Cu), the element which forms a solid solution with the conductive powder may include, for example, thorium (Th), lutetium (Lu), scandium (Sc), zirconium (Zr), promethium (Pm), terbium (Tb), erbium (Er), thulium (Tm), gadolinium (Gd), yttrium (Y), praseodymium (Pr), neodymium (Nd), samarium (Sm), dysprosium (Dy), holmium (Ho), lanthanum (La), cerium (Ce), hafnium (Hf), palladium (Pd), calcium (Ca), platinum (Pt), ytterbium (Yb), europium (Eu), plutonium (Pu), titanium (Ti), gold (Au), barium (Ba), strontium (Sr), phosphorus (P), uranium (U), lithium (Li), arsenic (As), magnesium (Mg), rhodium (Rh), silicon (Si), or aluminum (Al). The heat of mixing of representative combinations of an element which forms a solid solution with Cu are listed in the following Table 3.

TABLE 3

| X—Cu | Hm (KJ/mol) |
|---|---|
| Th—Cu | −24 |
| Lu—Cu | −24 |
| Sc—Cu | −24 |
| Zr—Cu | −23 |
| Pm—Cu | −23 |
| Tb—Cu | −23 |
| Er—Cu | −23 |
| Tm—Cu | −23 |
| Gd—Cu | −22 |
| Y—Cu | −22 |
| Pr—Cu | −22 |
| Nd—Cu | −22 |
| Sm—Cu | −22 |
| Dy—Cu | −22 |
| Ho—Cu | −22 |
| La—Cu | −21 |

TABLE 3-continued

| X—Cu | Hm (KJ/mol) |
|---|---|
| Ce—Cu | −21 |
| Hf—Cu | −17 |
| Pd—Cu | −14 |
| Ca—Cu | −13 |
| Pt—Cu | −12 |
| Yb—Cu | −12 |
| Eu—Cu | −10 |
| Pu—Cu | −9 |
| Ti—Cu | −9 |
| Au—Cu | −9 |
| Ba—Cu | −9 |
| Sr—Cu | −9 |
| P—Cu | −9 |
| U—Cu | −7 |
| Li—Cu | −5 |
| As—Cu | −3 |
| Mg—Cu | −3 |
| Rh—Cu | −2 |
| Si—Cu | −2 |
| Al—Cu | −1 |

For example, when the conductive powder includes nickel (Ni), the element which forms a solid solution with the conductive powder may include, for example, strontium (Sr), rhodium (Rh), antimony (Sb), iron (Fe), iridium (Ir), europium (Eu), tungsten (W), beryllium (Be), magnesium (Mg), tin (Sn), platinum (Pt), calcium (Ca), chromium (Cr), molybdenum (Mo), ytterbium (Yb), manganese (Mn), boron (B), zinc (Zn), germanium (Ge), gallium (Ga), vanadium (V), silver (Ag), aluminum (Al), silicon (Si), plutonium (Pu), phosphorus (P), lanthanum (La), cerium (Ce), tantalum (Ta), uranium (U), niobium (Nb), praseodymium (Pr), neodymium (Nd), yttrium (Y), samarium (Sm), gadolinium (Gd), holmium (Ho), promethium (Pm), terbium (Tb), dysprosium (Dy), erbium (Er), thulium (Tm), thulium (Tm), lutetium (Lu), scandium (Sc), thorium (Th), hafnium (Hf), or zirconium (Zr). The heat of mixing of representative combinations of an element which forms a solid solution with Ni are listed in the following Table 4.

TABLE 4

| X—Ni | Hm (KJ/mol) |
|---|---|
| Sr—Ni | −1 |
| Rh—Ni | −1 |
| Sb—Ni | −1 |
| Fe—Ni | −2 |
| Ir—Ni | −2 |
| Eu—Ni | −3 |
| W—Ni | −3 |
| Be—Ni | −4 |
| Mg—Ni | −4 |
| Sn—Ni | −4 |
| Pt—Ni | −5 |
| Ca—Ni | −7 |
| Cr—Ni | −7 |
| Mo—Ni | −7 |
| Yb—Ni | −7 |
| Mn—Ni | −8 |
| B—Ni | −9 |
| Zn—Ni | −9 |
| Ge—Ni | −11 |
| Ga—Ni | −15 |
| V—Ni | −18 |
| As—Ni | −19 |
| Al—Ni | −22 |
| Si—Ni | −23 |
| Pu—Ni | −25 |
| P—Ni | −26 |
| La—Ni | −27 |
| Ce—Ni | −28 |

TABLE 4-continued

| X—Ni | Hm (KJ/mol) |
|---|---|
| Ta—Ni | −29 |
| U—Ni | −29 |
| Nb—Ni | −30 |
| Pr—Ni | −30 |
| Nd—Ni | −30 |
| Y—Ni | −31 |
| Sm—Ni | −31 |
| Gd—Ni | −31 |
| Ho—Ni | −31 |
| Pm—Ni | −32 |
| Tb—Ni | −32 |
| Dy—Ni | −32 |
| Er—Ni | −34 |
| Tm—Ni | −34 |
| Ti—Ni | −35 |
| Lu—Ni | −36 |
| Sc—Ni | −39 |
| Th—Ni | −39 |
| Hf—Ni | −42 |
| Zr—Ni | −49 |

The element which has a high oxidation potential and may be present in the metallic glass has a higher oxidation potential (e.g., standard free energy of formation of oxide) than any other components included in the metallic glass. Such characteristic may allow the element to be oxidized before the other components of the metallic glass, thereby preventing their oxidation. The element having a high oxidation potential may have a standard free energy of formation of oxide at least about 0.1 electron volt (eV), specifically at least about 0.3 eV, more specifically at least about 0.5 eV, or at least about 1 eV greater than a standard free energy of formation of oxide of each of the other components of the metallic glass.

When a conductive paste including the metallic glass is applied under the atmospheric environment during the preparation of electrode, it may be exposed to oxygen. If the element having a low resistivity is oxidized, a conductive paste may have sharply deteriorated conductivity. When the element which forms a solid solution with the conductive powder is oxidized, a conductive paste may have decreased solid solubility. Thus oxidation of any of the element having a low resistivity, or the element which forms a solid solution with the conductive powder is undesirable.

Accordingly, when a metallic glass includes the element having a high oxidation potential having a higher oxidation potential than each of the element having a low resistivity, and the element which forms a solid solution with the conductive powder, the element having a high oxidation potential is first oxidized and forms a stable oxide layer on the surface of the metallic glass. The oxide layer substantially or effectively prevents oxidation of other components, such as the element having a low resistivity, and the element which forms a solid solution with the conductive powder therein. Furthermore, degradation of the properties of the conductive paste due to other components in the metallic glass, such as oxides of the element having a low resistivity, or the element which forms a solid solution with the conductive powder, may be prevented.

The element having a high oxidation potential may have a larger absolute value of a Gibbs Free Energy of oxide formation ($\Delta G_f^0$) than an absolute value of a Gibbs Free Energy of oxide formation of each of the element having a low resistivity, and the element which forms a solid solution with the conductive powder. The larger the absolute value of the Gibbs free energy of oxide formation an element has, the easier it may be oxidized. The element having a high oxidation potential may have an absolute value of a Gibbs Free Energy of oxide formation of more than about 100 kJ/mol, specifically more than about 120 kJ/mol, more specifically more than about 140 kJ/mol. In an embodiment, the absolute value of the Gibbs Free Energy of oxide formation of the element having a high oxidation potential is about 100 to 2500 kJ/mol, specifically about 120 to about 2300 kJ/mol, more specifically about 140 to about 1900 kJ/mol.

The following Table 5 provides Gibbs free energy of oxide formation of representative elements.

TABLE 5

| Metal oxide | $\Delta_f G^0$ (kJ/mol) |
|---|---|
| $Cu_2O$ | −146 |
| $Ti_2O$ | −147.3 |
| $RuO_4$ | −152.2 |
| CdO | −228.7 |
| ZnO | −320.5 |
| $Rh_2O_3$ | −343 |
| $K_2O_2$ | −425.1 |
| $Na_2O_2$ | −447.7 |
| $Ni_2O_3$ | −489.5 |
| $Bi_2O_3$ | −493.7 |
| SnO | −515.8 |
| BaO | −520.3 |
| $GeO_2$ | −521.4 |
| $Li_2O$ | −561.2 |
| SrO | −561.9 |
| MgO | −569.3 |
| BeO | −580.1 |
| PbO | −601.2 |
| CaO | 603.3 |
| $MoO_3$ | −668 |
| $WO_3$ | −764 |
| $Co_3O_4$ | −774 |
| $In_2O_3$ | −830.7 |
| $SiO_2$ | −856.3 |
| $TiO_2$ | −888.8 |
| $Ga_2O_3$ | −998.3 |
| $Fe_3O_4$ | −1015.4 |
| $ZrO_2$ | −1042.8 |
| $Cr_2O_3$ | −1058.1 |
| $B_2O_3$ | −1194.3 |
| $Mn_3O_4$ | −1283.2 |
| $Al_2O_3$ | −1582.3 |
| $La_2O_3$ | −1705.8 |
| $Nd_2O_3$ | −1720.8 |
| $Nb_2O_5$ | −1766 |
| $V_3O_5$ | −1803.3 |
| $Y_2O_3$ | −1816.6 |
| $Sc_2O_3$ | −1819.4 |
| $Ti_3O_5$ | −2317.4 |

The metallic glass may include an alloy of at least two elements of the element having a low resistivity, the element which forms a solid solution with the conductive powder, and the element having a high oxidation potential. Thus the at least two of the element having a low resistivity, the element which forms a solid solution with the conductive powder, and the element having a high oxidation potential that are included in the metallic glass is selected from the elements having a low resistivity, the elements which form a solid solution with the conductive powder, and the elements having a high oxidation potential. Accordingly, the metallic glass may have various combinations of the elements having a low resistivity, the elements which form a solid solution with the conductive powder, and the elements having a high oxidation potential. For example, when the elements having a low resistivity are 'A', 'A1', 'A2' et al., the elements which form a solid solution with the conductive powder are 'B', 'B1', 'B2' et al., and the elements having a high oxidation potential are 'C', 'C1', 'C2' et al., the combination may include alloys of various combinations of two components to six components et al. such as A-B, A-C, B-C, A-B-C, A-A1-B-B1, A-A1-B-B1-C, A-A1-B-B1-C-C1.

In an embodiment, the metallic glass includes two of the elements having a low resistivity, the elements which forms a solid solution with the conductive powder, and the elements having a high oxidation potential. In another embodiment, the metallic glass includes three of the elements having a low resistivity, the elements which forms a solid solution with the conductive powder, and the elements having a high oxidation potential. In another embodiment, the metallic glass includes each of the elements having a low resistivity, the elements which forms a solid solution with the conductive powder, and the elements having a high oxidation potential. In another embodiment, the metallic glass includes at least two of the elements having a low resistivity, and the elements which forms a solid solution with the conductive powder; the elements which forms a solid solution with the conductive powder, and the elements having a high oxidation potential; or elements having a low resistivity, the elements which forms a solid solution with the conductive powder, and the elements having a high oxidation potential. Also, in each embodiment, the elements having a low resistivity, the elements which forms a solid solution with the conductive powder, and the elements having a high oxidation potential may be the same or different. Also, a metal of the conductive powder may be the same or different than each of the elements having a low resistivity, the elements which forms a solid solution with the conductive powder, and the elements having a high oxidation potential.

Herein, the element having a low resistivity may be included to provide conductivity and may form an alloy with at least one selected from the element which forms a solid solution with the conductive powder, and the element having a high oxidation potential.

A supercooled liquid region of the metallic glass may range from about 5° C. to about 200° C., specifically about 10° C. to about 180° C., more specifically about 20° C. to about 160° C., that is having a span of about 5° C. to about 200° C., specifically about 10° C. to about 180° C., more specifically about 20° C. to about 160° C.

Also the supercooled liquid region may be within a temperature range of about 100° C. to about 800° C., specifically about 150° C. to about 750° C., more specifically about 200° C. to about 700° C.

Herein, the supercooled liquid region of a metallic glass is a temperature region between a glass transition temperature ("$T_g$") and a crystallization temperature ("$T_c$") of the metallic glass. In the supercooled liquid region, the metallic glass has relatively low viscosity and shows a liquid-like behavior. The glass transition temperature may be about 50° C. to about 700° C., specifically about 75° C. to about 650° C., more specifically about 100° C. to about 600° C. Also, the crystallization temperature may be about 60° C. to about 720° C., specifically about 85° C. to about 670° C., more specifically about 110° C. to about 620° C.

In the supercooled liquid region, which is a temperature region between glass transition temperature ($T_g$) and crystallization temperature ($T_c$), the metallic glass shows a liquid-like behavior and can wet a lower layer (e.g., lower semiconductor layer) of a solar cell or other electronic device, e.g., semiconductor substrate. Herein, when the supercooled liquid region is large, the conductive paste may improve wetting properties towards a substrate, such as a semiconductor substrate.

For example, when a conductive paste including the metallic glass is applied on a semiconductor substrate to fabricate an electrode for a solar cell, the larger the supercooled liquid region of the softened metallic glass on the semiconductor substrate, the better the conductive paste wets the semiconductor substrate. The improved wetting properties of the conductive paste may allow the conductive powder, which diffuses into the softened metallic glass, to permeate into a larger area of the semiconductor substrate. Accordingly, the electrode disposed on the semiconductor substrate may have better contact (e.g., electrical contact) with the semiconductor substrate, thereby improving adherence therebetween and providing a larger or improved conductive path through which charges produced in the semiconductor substrate by solar light may transport. As a result, the electrode may improve efficiency of a solar cell.

The following Table 6 shows that when a metallic glass including copper (Cu) and zirconium (Zr), and further including aluminum (Al), silver (Ag), nickel (Ni), titanium (Ti), iron (Fe), palladium (Pd) and/or hafnium (Hf), the metallic glass has a large supercooled liquid region.

At least one selected from aluminum (Al), silver (Ag), nickel (Ni), titanium (Ti), iron (Fe), palladium (Pd) and hafnium (Hf) may be included in an amount of about 10 atomic percent (at %) or less, specifically about 5 at % or less, more specifically about 0.1 to about 10 at %, or about 1 to about 8 at %, based on a total amount of the metallic glass. When it is included within the foregoing range, a metallic glass may include the other components in a sufficient amount. Accordingly, the metallic glass may have sufficient conductivity and oxidation resistance as the metallic glass may have a large supercooled liquid region as well as improved solid solubility with the conductive powder.

As described above, the supercooled liquid region of a metallic glass is a temperature region between a glass transition temperature ("$T_g$") and a crystallization temperature ("$T_c$") of the metallic glass. Thus, the supercooled liquid region of a metallic glass can be characterized as the difference between $T_c$ and $T_g$.

TABLE 6

| | Glass transition temperature (Tg, K) | Crystallization temperature (Tc, K) | Supercooled liquid region (ΔTx, K) |
|---|---|---|---|
| $Cu_{50}Zr_{50}$ | 675 | 724 | 49 |
| $Cu_{54}Zr_{22}Ni_6Ti_{18}$ | 712 | 769 | 57 |
| $Cu_{48}Zr_{48}Al_4$ | 688 | 756 | 68 |
| $Cu_{47}Zr_{47}Al_6$ | 691 | 770 | 79 |
| $Cu_{50}Zr_{43}Al_7$ | 731 | 792 | 61 |
| $Cu_{46}Zr_{46}Al_8$ | 696 | 789 | 93 |
| $Cu_{45}Zr_{45}Al_{10}$ | 710 | 787 | 77 |
| $Cu_{45}Zr_{45}Ag_{10}$ | 683 | 756 | 73 |
| $Cu_{48}Zr_{48}Al_2Ag_2$ | 677 | 742 | 65 |
| $Cu_{46}Zr_{46}Al_4Ag_4$ | 686 | 767 | 81 |
| $Cu_{47}Zr_{45}Al_4Ag_4$ | 688 | 770 | 82 |
| $Cu_{48}Zr_{44}Al_4Ag_4$ | 692 | 779 | 87 |
| $Cu_{49}Zr_{43}Al_4Ag_4$ | 694 | 780 | 86 |
| $Cu_{50}Zr_{42}Al_4Ag_4$ | 703 | 784 | 81 |
| $Cu_{45}Zr_{45}Al_5Ag_5$ | 697 | 783 | 86 |
| $Cu_{44}Zr_{44}Al_6Ag_6$ | 698 | 790 | 92 |
| $Cu_{30}Zr_{48}Al_8Ag_8Ni_6$ | 688 | 779 | 91 |
| $Cu_{34}Zr_{48}Al_8Ag_8Ni_2$ | 683 | 799 | 116 |
| $Cu_{26}Zr_{48}Al_8Ag_8Ni_{10}$ | 692 | 768 | 76 |
| $Cu_{22.8}Zr_{61.4}Al_{9.9}Ag_1Fe_{4.95}$ | 656 | 753 | 97 |
| $Cu_{34}Zr_{48}Al_8Ag_8Fe_2$ | 705 | 806 | 101 |
| $Cu_{36}Zr_{46}Al_8Ag_8Hf_2$ | 692 | 794 | 102 |
| $Cu_{36}Zr_{42}Al_8Ag_8Hf_6$ | 695 | 796 | 101 |
| $Cu_{34}Zr_{48}Al_8Ag_8Pd_2$ | 699 | 794 | 95 |
| $Cu_{30}Zr_{48}Al_8Ag_8Pd_6$ | 709 | 796 | 87 |

The metallic glass may be at least one selected from, for example, $Cu_{50}Zr_{50}$, $Cu_{54}Zr_{22}Ni_6Ti_{18}$, $Cu_{48}Zr_{48}Al_4$, $Cu_{45}Zr_{45}Ag_{10}$, $Cu_{47}Zr_{45}Al_4Ag_4$, $Cu_{43}Zr_{43}Al_7Ag_7$, $Cu_{30}Zr_{48}Al_8Ag_8Ni_6$, $Cu_{22.8}Zr_{61.4}Al_{9.9}Ag_1Fe_{4.95}$, $Cu_{36}Zr_{46}Al_8Ag_8Hf_2$, $Cu_{30}Ag_{30}Zr_{30}Ti_{10}$, $Ti_{50}Ni_{15}Cu_{32}Sn_3$, $Ti_{45}Ni_{15}Cu_{25}Sn_3Be_7Zr_5$, $Ni_{60}Nb_{30}Ta_{10}$, $Ni_{61}Zr_{20}Nb_7Al_4Ta_8$, $Ni_{57.5}Zr_{35}Al_{7.5}$, $Zr_{41.2}Ti_{13.8}Ni_{10}Cu_{12.5}Be_{22.5}$, $Mg_{65}Y_{10}Cu_{15}Ag_5Pd_5$, $Mn_{55}Al_{25}Ni_{20}$, $La_{55}Al_{25}Ni_{10}Cu_{10}$, $Mg_{65}Cu_{7.5}Ni_{7.5}Ag_5Zn_5Gd_{10}$, $Mg_{65}Cu_{15}Ag_{10}Y_6Gd_4$, $Fe_{77}Nb_6B_{17}$, $Fe_{67}Mo_{13}B_{17}Y_3$, $Ca_{65}Mg_{15}Zn_{20}$, $Ca_{66.4}Al_{33.6}$, $Mg_{65}Cu_{15}Ag_{10}Gd_{10}$, $Mg_{65}Cu_{15}Ag_{10}Gd_{10}$, $Mg_{65}Cu_{25}Gd_{10}$, $Mg_{65}Cu_{20}Ag_5Y_{10}$, $Mg_{65}Cu_{25}Y_{10}$, $Mg_{65}Cu_{15}Ag_{10}Y_{10}$, $Cu_{46}Gd_{47}Al_7$, $Ca_{60}Mg_{25}N_{15}$, $Mg_{65}Cu_{15}Ag_5Pd_5Gd_{10}$, $Mg_{70}Ni_{10}Gd_{20}$, $Cu_{46}Y_{42.5}Al_7$, $Ti_{55}Zr_{18}Be_{14}Cu_7Ni_6$, $Ti_{51}Y_4Zr_{18}Be_{14}Cu_7Ni_6$, $Ti_{40}Zr_{28}Cu_9Ni_7Be_{16}$, $Ti_{40}Zr_{25}Ni_8Cu_9Be_{18}$, $Ti_{49}Nb_6Zr_{18}Be_{14}Cu_7Ni_6$, $Ti_{50}Zr_{15}Be_{18}Cu_9Ni_8$, $Ti_{34}Zr_{31}Cu_{10}Ni_8Be_{17}$, $Zr_{36}Ti_{24}Be_{40}$, $Ti_{65}Be_{18}Cu_9Ni_8$, $Zr_{65}Al_{7.5}Cu_{17.5}Ni_{10}$, $Zr_{65}Al_{7.5}Cu_{12.6}Ni_{10}Ag_5$, $Cu_{50}Zr_{40}Ti_{10}$, $Cu_{30}Ag_{30}Zr_{30}Ti_{10}$, $Ni_{55}Zr_{12}Al_{11}Y_{22}$, and $Cu_{40}Ni_5Ag_{15}Zr_{30}Ti_{10}$, but is not limited thereto.

The organic vehicle may include an organic compound, an optional organic solvent, and optional additives known for use in the manufacture of conductive pastes for solar cells. The organic vehicle is combined with the conductive powder and the metallic glass primarily to provide a viscosity and rheology to the conductive paste effective for printing or coating the conductive paste. A wide variety of inert organic materials can be used, and can be selected by one of ordinary skill in the art without undue experimentation to achieve the desired viscosity and rheology, as well as other properties such as dispersibility of the conductive powder and the metallic glass, stability of conductive powder and the metallic glass and any dispersion thereof, drying rate, firing properties, and the like. Similarly, the relative amounts of the organic compound, any optional organic solvent, and any optional additive can be adjusted by one of ordinary skill in the art without undue experimentation in order to achieve the desired properties of the conductive paste.

The organic compound may be a polymer, for example, at least one selected from a C1 to C4 alkyl(meth)acrylate-based resin; a cellulose such as ethyl cellulose or hydroxyethyl cellulose; a phenolic resin; wood rosin; an alcohol resin; a halogenated polyolefin such as tetrafluoroethylene (e.g., TEFLON); and the monobutyl ether of ethylene glycol monoacetate.

The organic vehicle may further optionally include at least one additive selected from, for example, a surfactant, a thickener, and a stabilizer.

The solvent may be any solvent capable of dissolving or suspending the above other components of the conductive paste and may be, for example, at least one selected from terpineol, butylcarbitol, butylcarbitol acetate, pentanediol, dipentyne, limonene, an ethyleneglycol alkylether, a diethyleneglycol alkylether, an ethyleneglycol alkylether acetate, a diethyleneglycol alkylether acetate, a diethyleneglycol dialkylether acetate, a triethyleneglycol alkylether acetate, a triethylene glycol alkylether, a propyleneglycol alkylether, propyleneglycol phenylether, a dipropyleneglycol alkylether, a tripropyleneglycol alkylether, a propyleneglycol alkylether acetate, a dipropyleneglycol alkylether acetate, a tripropyleneglycol alkyl ether acetate, dimethylphthalic acid, diethylphthalic acid, dibutylphthalic acid, and desalted water.

The conductive powder, the metallic glass, and the organic vehicle may be included in an amount of about 30 to about 99 weight percent (wt %), about 0.1 to about 20 wt %, and about 0.9 to about 69.9 wt %, specifically about 40 to about 98 wt %, about 1 to about 20 wt %, and about 1 to about 59 wt %, more specifically about 40 to about 95 wt %, about 2 to about 20 wt %, and about 3 to about 58 wt %, further specifically about 50 to about 90 wt %, about 4 to about 20 wt %, and about 6 to about 46 wt %, respectively, based on the total weight of the conductive paste.

The conductive paste is prepared by combining the components of the conductive paste by, for example, mechanical mixing. The conductive paste may be screen-printed to provide an electrode for an electronic device.

Hereinafter, illustrated is an electrode fabricated using the aforementioned conductive paste referring to FIGS. 1 to 4C.

Figure 1:
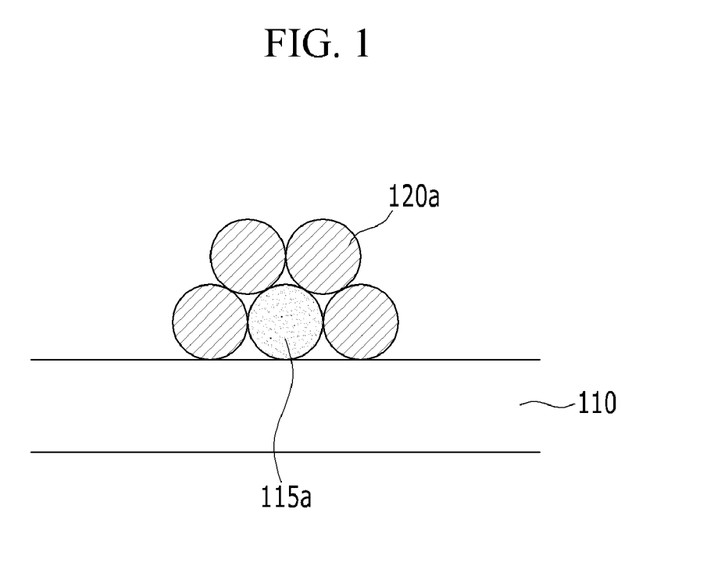
FIGS. 1 to 3 are a schematic diagram of an embodiment of heat treating a conductive powder and a metallic glass on a semiconductor substrate.
Figure 2:
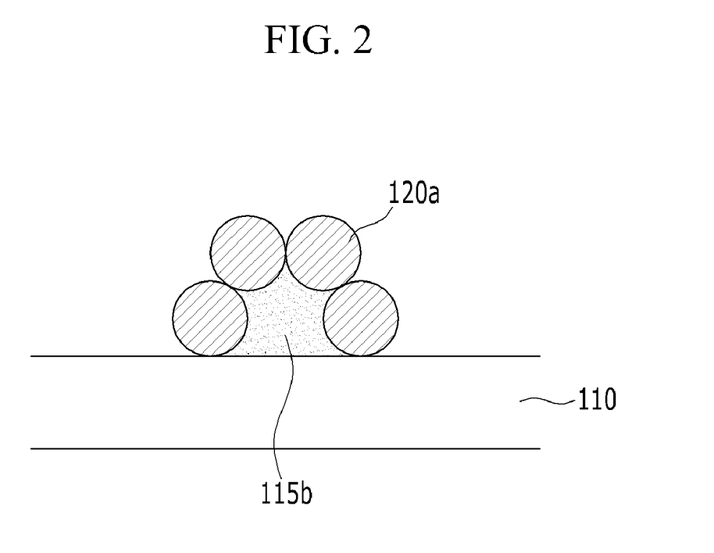
Figure 3:
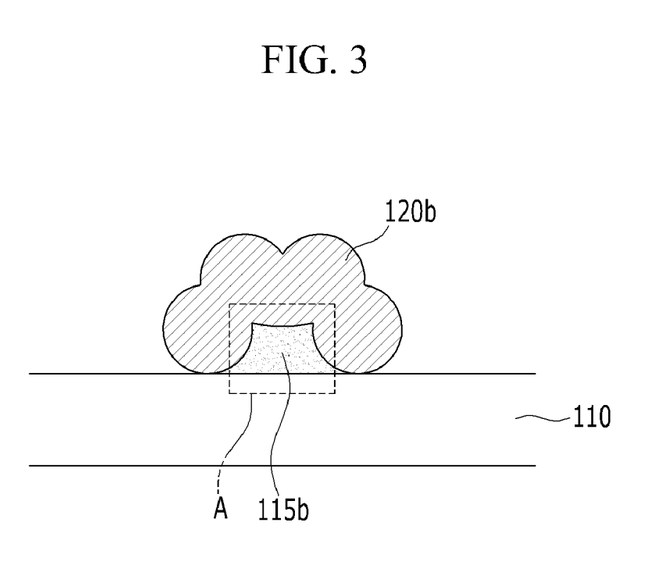
Figure 4A:
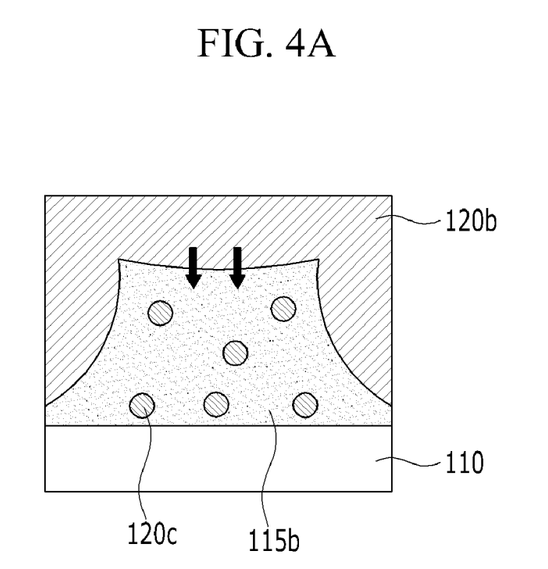
FIGS. 4A to 4C are a schematic diagram showing an expanded view of region A of FIG. 3.
Figure 4B:
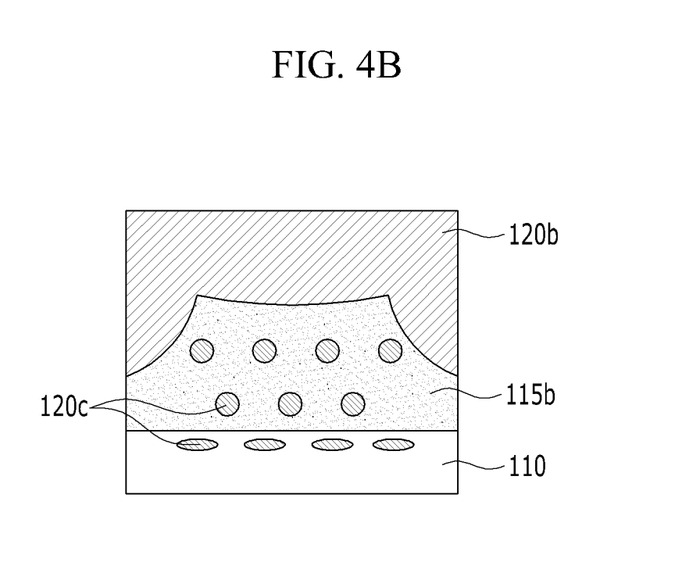
Figure 4C:
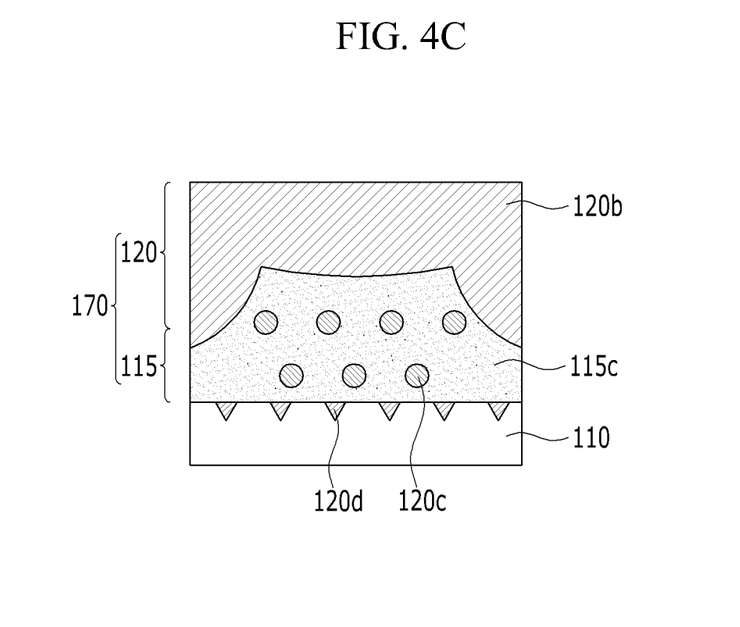

FIGS. 1 to 3 are a schematic diagram showing that when a conductive paste according to an embodiment is applied on a semiconductor substrate, a conductive powder and a metallic glass included therein are transformed due to heat and contact with the semiconductor substrate. FIGS. 4A to 4C are a schematic diagram enlarging region A of FIG. 3.

Referring to FIG. 1, a conductive paste including a conductive powder 120*a* and a metallic glass 115*a* is applied on a semiconductor substrate 110. The conductive powder 120*a* and the metallic glass 115*a* may each have the form of a particle having a spherical shape, for example.

Referring to FIG. 2, when the metallic glass 115*a* is heated to a first temperature higher than its glass transition temperature ("$T_g$"), the metallic glass 115*a* becomes soft and turns into a liquid-like metallic glass 115*b*. The first temperature may be about 1 to about 300° C., specifically about 5 to about 250° C., more specifically about 10 to about 200° C. higher than the $T_g$ of the metallic glass. The liquid-like metallic glass 115*b*, which has a liquid-like properties, may fill a gap among a plurality of particles of the conductive powder 120*a*. Herein, the metallic glass 115*a* is first softened, because the glass transition temperature ("$T_g$") of the metallic glass 115*a* is lower than the sintering temperature ("$T_s$") of the conductive powder 120*a*.

Referring to FIG. 3, when a conductive paste is heated to a second temperature higher than the sintering temperature, the conductive powder 120*a* is sintered and particles of the conductive powder 120*a* closely bond with neighboring particles of conductive powder 120*a* to form a conductive powder agglomerate 120*b*. The second temperature may be about 1 to about 300° C., specifically about 5 to about 250° C., more specifically about 10 to about 200° C. higher than the $T_s$ of the metallic glass.

As shown in FIGS. 2 and 3, the liquid-like metallic glass, which has liquid-like properties, is a supercooled liquid and wets a semiconductor substrate 110.

Referring to FIG. 4A, when the liquid-like metallic glass 115*b* is a supercooled liquid, some conductive particles 120*c* of the conductive powder agglomerate 120*b* diffuse into the liquid-like metallic glass 115*b*. As aforementioned, the liquid-like metallic glass 115*b* includes a component which can form a solid solution with the conductive powder agglomerate 120*b*.

In addition, as aforementioned, when a metallic glass has a large supercooled liquid region, the liquid-like metallic glass 115*b* has a low viscosity and remains on and wets the semiconductor substrate 110. Accordingly, contact between the liquid-like metallic glass 115*b* and the semiconductor substrate 110 is improved.

Referring to FIG. 4B, when heated to a third temperature higher than the second temperature, conductive particles 120*c* diffuse into the liquid-like metallic glass 115*b* and permeate into the semiconductor substrate 110. The third temperature may be about 1 to about 300° C., specifically about 5 to about 250° C., more specifically about 10 to about 200° C. higher than the second temperature. Herein, as aforementioned, the liquid-like metallic glass 115*b* may have improved wetting properties and provide improved contact with the semiconductor substrate 110. Accordingly, the metallic glass may have a larger area in which conductive particles 120c permeate into the semiconductor substrate 110.

Referring to FIG. 4C, when the semiconductor substrate 110 is cooled down, conductive particles 120c permeated into the semiconductor substrate 110 crystallize to form crystallized conductive particles 120d at the surface of the semiconductor substrate 110. Also, the liquid-like metallic glass 115b may also crystallize to form a crystalline metallic glass 115c and the conductive particles 120c in the metallic glass may also crystallize.

In this way, an electrode 170 including the conductive powder agglomerate 120b may be formed.

The electrode 170 may include a buffer layer 115 including a crystalline metallic glass 115c and positioned at a region which is adjacent to the semiconductor substrate 110, and an electrode portion 120 positioned at a region except the buffer layer and including a conductive material.

FIG. 4C shows that the buffer layer 115 is formed, but is not limited thereto. The buffer layer 115 may be omitted, or may be formed on a part of a region which is adjacent to the semiconductor substrate 110.

The crystallized conductive particles 120d in the buffer layer 115 and at the surface of the semiconductor substrate 110 effectively improve transfer of charges produced by solar light in the semiconductor substrate 110 to the electrode portion 120 and, simultaneously, decrease a contact resistance between the semiconductor substrate 110 and the electrode portion 120, thereby decreasing charge loss of a solar cell. Ultimately, the solar cell may have improved efficiency. The electrode may be used as a conductive electrode for various other electronic devices.

The electrode may have a contact resistance of about 1 k$\Omega$cm$^2$ or less, specifically about 1 $\mu\Omega$cm$^2$ to about 10 $\Omega$cm$^2$. When it is included within the foregoing range, the electrode may effectively decrease loss of electric power, and an electronic device, for example, a solar cell may have improved efficiency.

The electrode may have a resistivity of about 10 m$\Omega$cm or less, specifically about 1 $\mu\Omega$cm to about 100 $\mu\Omega$cm. When it is included within the foregoing range, the electrode may effectively decrease loss of electric power, and an electronic device, for example, a solar cell may have improved efficiency.

A representative electronic device is a solar cell.

Figure 5:
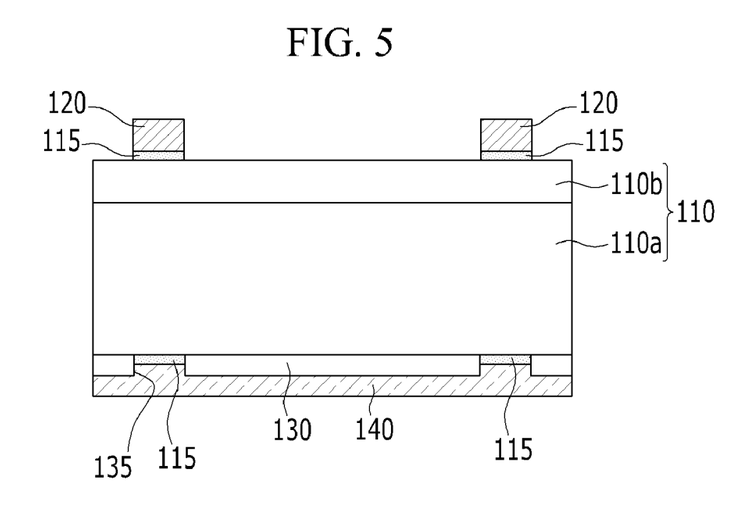
FIG. 5 is a cross-sectional view of an embodiment of a solar cell.

Referring to FIG. 5, a solar cell according to an embodiment is disclosed in further detail.

FIG. 5 is a cross-sectional view showing a solar cell according to an embodiment.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, positions of (or spatial relationships between) components will be described with respect to a semiconductor substrate 110 for better understanding and ease of description, but the disclosed embodiment is not limited thereto. In addition, for clarity of description, a solar energy incident side of a semiconductor substrate 110 is called a front side, and the opposite side is called a rear side, although alternative configurations are possible.

Referring to FIG. 5, a solar cell according to an embodiment may include a semiconductor substrate 110 including a lower semiconductor layer 110a and an upper semiconductor layer 110b.

The semiconductor substrate 110 may comprise a crystalline silicon or a compound semiconductor. The crystalline silicon may be, for example, a silicon wafer. One of the lower semiconductor layer 110a and the upper semiconductor layer 110b may be a semiconductor layer doped with a p-type impurity, and the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element such as boron (B), and the n-type impurity may be a Group V element such as phosphorus (P).

The surface of the upper semiconductor layer 110b may be textured, for example by surface texturing. The surface-textured upper semiconductor layer 110b may have protrusions and depressions, and may comprise a pyramidal shape, or may have a porous structure having a honeycomb shape, for example. The surface-textured upper semiconductor layer 110b may have an enhanced surface area to improve the light-absorption rate and decrease reflectivity, thereby improving efficiency of a solar cell.

A front electrode is disposed (e.g., formed) on the upper semiconductor layer 110b. The front electrode may be arranged in parallel to a direction of the substrate, and may have a grid pattern shape to reduce shadowing loss and sheet resistance.

The front electrode may include a buffer layer 115 including a crystalline metallic glass 115c and positioned at a region which is adjacent to the upper semiconductor layer 110b, and a front electrode portion 120 positioned at a region except the buffer layer 115 and including a conductive material.

The front electrode may be disposed by a screen printing a conductive paste. The conductive paste is the same as described above.

The front electrode portion 120 may include a conductive material, for example, a low resistivity conductive material such as silver (Ag).

A buffer layer 115 is disposed between the upper semiconductor layer 110b and the front electrode portion 120 by heat treating the conductive paste disposed to form the front electrode. The buffer layer 115 may be conductive due to inclusion of the metallic glass. Because the buffer layer 115 has portions that are adjacent to the electrode portion 120 and the upper semiconductor layer 110b, it may decrease loss of electric charges by enlarging the effective path for transferring electric charges between the upper semiconductor layer 110b and the front electrode portion 120. The buffer layer may also reduce resistive losses, for example.

The metallic glass of the buffer layer 115 is derived from the conductive paste used to form the front electrode. The metallic glass may melt before the conductive material of the front electrode portion 120 during processing, so that the metallic glass is disposed under the front electrode portion 120 to form the buffer layer.

FIG. 5 shows that the buffer layer 115 is formed, but is not limited thereto. The buffer layer 115 may be omitted, or may be formed on a part of a region which is adjacent to the upper semiconductor layer 110b.

A bus bar electrode (not shown) may be disposed on the front electrode portion 120. The bus bar electrode can connect adjacent solar cells of a plurality of solar cells.

A dielectric layer 130 may be formed under the semiconductor substrate 110. The dielectric layer 130 may increase efficiency of a solar cell by substantially or effectively preventing recombination of electric charges and leaking of electric current. The dielectric layer 130 may include a penetration part 135 (e.g., a through hole), and the semiconductor substrate 110 and a rear electrode 140 that will be further described below may contact through the penetration part 135.

The dielectric layer 130 may include at least one selected from silicon oxide ($SiO_2$), silicon nitride ($SiN_x$), aluminum oxide ($Al_2O_3$, and may have a thickness of about 100 to about 2000 angstroms (Å), specifically about 200 to about 1800 Å, more specifically about 300 to about 1600 Å.

A rear electrode is disposed under the dielectric layer 130. The rear electrode may include a conductive material, and the conductive material may be an opaque metal such as aluminum (Al). The rear electrode may be disposed by screen printing a conductive paste in the same manner as the front electrode.

The rear electrode may include a buffer layer 115 positioned at a region which is adjacent to a lower semiconductor layer 110a, and a rear electrode portion 140 positioned at a region except the buffer layer and including a conductive material in the same manner as the front electrode.

Hereinafter, a method of manufacturing the solar cell is further described with reference to FIG. 5.

First, a semiconductor substrate 110, such as a silicon wafer, is prepared. The semiconductor substrate 110 may be doped with an impurity, such as a p-type impurity, as an example.

Then the semiconductor substrate 110 may be subjected to a surface texturing treatment. The surface-texturing treatment may be performed by a wet method using at least one strong acid selected from, for example, nitric acid, hydrofluoric acid, and the like, or at least one strong base selected from, for example, sodium hydroxide and the like; or the surface-texturing treatment may be performed by a dry method such as plasma treatment.

Then, the semiconductor substrate 110 may be doped with an n-type impurity, for example. The n-type impurity may be doped by diffusing at least one selected from, for example, $POCl_3$, $H_3PO_4$, and the like at a high temperature. The semiconductor substrate 110 includes a lower semiconductor layer 110a and an upper semiconductor layer 110b doped with different impurities than each other.

Then a conductive paste for a front electrode is applied on the upper semiconductor layer 110b. The conductive paste for a front electrode may be applied by a screen printing method. The screen printing method includes applying the conductive paste, which comprises a conductive powder, a metallic glass, and an organic vehicle at a location where a front electrode is disposed, and drying the same.

As further disclosed above, the conductive paste may include a metallic glass, and the metallic glass may be prepared using any suitable method such as melt spinning, infiltration casting, gas atomization, ion irradiation, or mechanical alloying.

Then the conductive paste for a front electrode may be dried.

A dielectric layer 130 may be provided by disposing (e.g., stacking, forming, or depositing) aluminum oxide ($Al_2O_3$) or silicon oxide ($SiO_2$) on an entirety of or on a portion of a rear side of the semiconductor substrate 110. The dielectric layer 130 may be disposed by a plasma enhanced chemical vapor deposition ("PECVD") method, for example.

Then a penetration part 135 may be provided on a portion of the dielectric layer 130 by ablation with a laser, for example.

The conductive paste for a rear electrode is subsequently applied on a side of the dielectric layer 130, which in an embodiment is opposite the semiconductor substrate 110, by a screen printing method.

Then, a conductive paste for a rear electrode is dried.

Next, the conductive paste for a front electrode and the conductive paste for a rear electrode are co-fired (e.g., heat treated), or fired individually. Thus the conductive paste for a front electrode and the conductive paste for a rear electrode may be fired in the same or in different processes.

The firing may be performed in a furnace and at a temperature higher than the melting temperature of the conductive metal, for example at a temperature ranging from about 400° C. to about 1000° C., specifically about 450° C. to about 950° C., more specifically about 500° C. to about 900° C.

Hereinafter, a solar cell according to another embodiment is disclosed referring to FIG. 6.

Figure 6:
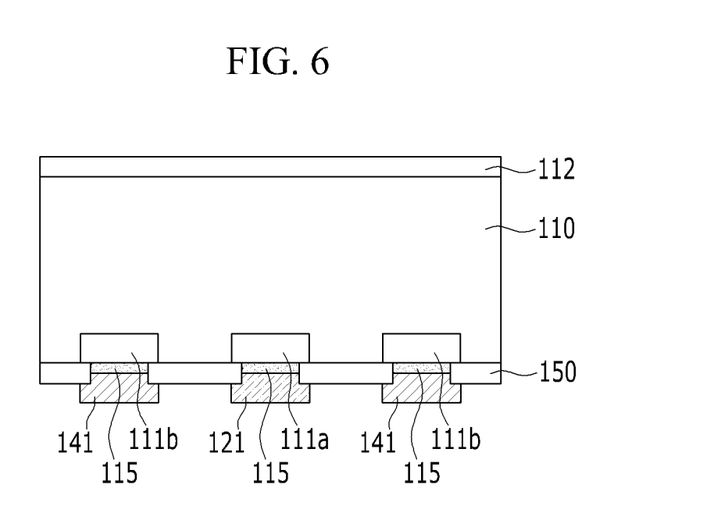
FIG. 6 is a cross-sectional view of another embodiment of a solar cell.

FIG. 6 is a cross-sectional view showing a solar cell according to another embodiment.

A solar cell may include a semiconductor substrate 110 doped with a p-type or an n-type impurity. The semiconductor substrate 110 may include a first doping region 111a and second doping region 111b that are provided on the rear side of the semiconductor substrate 110, and are doped with different impurities than each other. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured, and therefore may enhance the light-absorption rate and decrease the reflectivity of the solar cell, thereby improving efficiency of the solar cell. An insulation layer 112 is provided on the semiconductor substrate 110. The insulation layer 112 may comprise an insulating material that is substantially transparent and thus absorbs little light, for example at least one selected from silicon nitride ($SiN_x$), silicon oxide ($SiO_2$), titanium oxide ($TiO_2$), aluminum oxide ($Al_2O_3$), magnesium oxide (MgO), and cerium oxide ($CeO_2$). The insulation layer 112 may be a single layer or more than one layer. The insulation layer 112 may have a thickness ranging from about 200 to about 1500 Å, specifically 300 to about 1400 Å, more specifically about 400 to about 1300 Å.

The insulation layer 112 may be an anti-reflective coating ("ARC") that decreases the reflectivity of light and increases selectivity of a particular wavelength region on the surface of the solar cell, and simultaneously improves properties of silicon on the surface of the semiconductor substrate 110, thereby increasing efficiency of the solar cell.

A dielectric layer 150 including first and second penetration parts may be disposed on the rear side of the semiconductor substrate 110.

The first electrode electrically connected with the first doping region 111a and the second electrode electrically connected with the second doping region 111b are disposed on the rear side of the semiconductor substrate 110, respectively. The first electrode and the first doping region 111a may be contacted through the first penetration part, and the second electrode and the second doping region 111b may be in contact through the second penetration part. The first electrode and the second electrode may be alternately disposed.

The first electrode may include a buffer layer 115 positioned at a region which is adjacent to the first doping region 111a, and a first electrode portion 121 positioned at a region except the buffer layer 115. The second electrode may include a buffer layer 115 positioned at a region which is adjacent to the second doping region 111b, and a second electrode portion 141 positioned at a region except the buffer layer 115.

As disclosed in the above embodiment, the front electrode and the rear electrode may be disposed using a conductive paste including a conductive powder, a metallic glass, and an organic vehicle, which is the same as described above.

A buffer layer 115 is disposed between the first doping region 111a and the first electrode portion 121, or between the second doping region 111b and the second electrode portion 141. The buffer layer 115 may be electrically conductive due inclusion of a metallic glass. Because the buffer layer 115 includes portions which are adjacent to either the first electrode portion 121 or the second electrode portion 141, and portions which are adjacent to either the first doping region 111a or the second doping region 111b, respectively, loss of electric charge may be decreased by enlarging or otherwise improving the path for transferring electric charge between the first doping region 111a and the first electrode portion 121, or between the second doping region 111b and the second electrode portion 141. In addition, the buffer layer 115 may substantially or effectively prevent a material of the first electrode portion 121 or the second electrode portion 141 from diffusing into the first or second doping regions 111a or 111b, respectively.

FIG. 6 shows that the buffer layer 115 is formed, but is not limited thereto. The buffer layer 115 may be omitted, or may be formed on a part of a region which is adjacent to the first doping region 111a, a part of a region which is adjacent to the second doping region 111b, or a combination thereof.

A solar cell according to the embodiment including both of the first electrode and the second electrode on the rear surface of the solar cell may decrease an area where a metal is disposed on the front surface. This may decrease shadowing loss and increase solar cell efficiency.

Hereinafter, the method of manufacturing a solar cell will be further disclosed referring to FIG. 6.

First, a semiconductor substrate 110 doped with, for example, an n-type impurity is prepared. Then, the semiconductor substrate 110 is surface-textured, and insulation layer 112 and dielectric layer 150 are disposed on a front side and a rear side of the semiconductor substrate 110, respectively. The insulation layer 112 and the dielectric layer 150 may be provided by chemical vapor deposition ("CVD"), for example.

Then, the first doping region 111a and the second doping region 111b may be disposed by sequentially doping a p-type impurity and an n-type impurity at a high concentration in the rear side of the semiconductor substrate 110.

Then, a conductive paste for a first electrode is applied on a portion (e.g. on a side) of the dielectric layer 150 corresponding to the first doping region 111a, and a conductive paste for a second electrode is applied a portion of the dielectric layer 150 corresponding to the second doping region 111b. The conductive paste for the first electrode and the conductive paste for the second electrode may be disposed by screen printing, for example, and the conductive paste may include the conductive powder, the metallic glass, and the organic vehicle.

Next, the conductive paste for the first electrode and the conductive paste for the second electrode may be fired together or separately. The firing (e.g., heat treating) may be performed in a furnace at a temperature higher than the melting temperature of a conductive metal.

Herein, the conductive paste is applied to provide an electrode for a solar cell, but the conductive paste may also be used to provide an electrode for various other electronic devices such as a plasma display panel ("PDP"), a liquid crystal display ("LCD"), or an organic light emitting diode ("OLED").

The following examples illustrate this disclosure in more detail. However, it is understood that this disclosure is not limited by these examples.

Preparing Conductive Paste and Electrode

Example 1

Silver (Ag) powder and metallic glass of $Cu_{50}Zr_{50}$ are added into an organic vehicle including an ethyl cellulose binder and a butyl carbitol solvent. The silver (Ag) powder, the metallic glass of $Cu_{50}Zr_{50}$, and the organic vehicle are mixed at about 84 wt %, about 4 wt %, and about 12 wt %, respectively, based on the total amount of conductive paste.

It is kneaded using a 3-roll mill to provide a conductive paste.

The conductive paste is coated on a silicon wafer by a screen printing method. Then it is rapidly heated to about 500° C. using a belt furnace, and slowly heated to about 900° C. It is cooled to provide an electrode.

Example 2

A conductive paste is prepared in accordance with the same procedure as in Example 1 to provide an electrode, except that $Cu_{43}Zr_{43}Al_7Ag$, is used as a metallic glass instead of $Cu_{50}Zr_{50}$.

Assessment—1

Each contact resistance and resistivity of electrodes obtained from Examples 1 and 2 is determined. The contact resistance and the resistivity are determined by a transfer length method (TLM).

Table 7 shows the contact resistance and the resistivity of each electrode obtained from Examples 1 and 2.

TABLE 7

|  | Contact resistance (m$\Omega$cm$^2$) | Resistivity (μ$\Omega$cm) |
| --- | --- | --- |
| Example 1 | 60.57 | 3.2 |
| Example 2 | 39 | 2.87 |

As shown in Table 7, it can be observed that the electrodes obtained in Examples 1 and 2 have low contact resistance and resistivity.

Additionally, the electrode obtained in Example 2 has lower contact resistance and resistivity than the electrode obtained in Example 1, because the metallic glass used in the electrode of Example 2 includes silver (Ag) as well as aluminum (Al) capable of providing a solid-solution with silver (Ag).

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductive paste comprising:
a conductive powder,
a metallic glass, and
an organic vehicle,
wherein the metallic glass comprises an alloy having a disordered atomic structure and at least two elements selected from
an element having a low resistivity,
an element which forms a solid solution with the conductive powder,
an element having a high oxidation potential,
wherein the element having a low resistivity has a resistivity of less than about 100 microohm-centimeters, and
the element having a high oxidation potential has an absolute value of a Gibbs free energy of oxide formation of about 100 kiloJoules per mole or greater.

2. The conductive paste of claim 1, wherein the conductive powder comprises a silver, an aluminum, a copper, a nickel or a combination thereof.

3. The conductive paste of claim 1, wherein the conductive powder has a size range from about 1 nm to about 50 μm.

4. The conductive paste of claim 1, wherein the element having the low resistivity has a resistivity of less than about 15 microohm-centimeters.

5. The conductive paste of claim 1, wherein the element having the low resistivity comprises at least one selected from silver, copper, gold, aluminum, calcium, beryllium, magnesium, sodium, molybdenum, tungsten, tin, zinc, nickel, potassium, lithium, iron, palladium, platinum, rubidium, chromium, and strontium.

6. The conductive paste of claim 1, wherein the element which forms the solid solution with the conductive powder has a heat of mixing with the conductive powder of less than 0 KJ/mol.

7. The conductive paste of claim 6, wherein the element which forms the solid solution with the conductive powder comprises at least one selected from lanthanum, cerium, praseodymium, promethium, samarium, lutetium, yttrium, neodymium, gadolinium, terbium, dysprosium, holmium, erbium, thulium, thorium, calcium, scandium, barium, ytterbium, strontium, europium, zirconium, lithium, hafnium, magnesium, phosphorus, arsenic, palladium, gold, plutonium, gallium, germanium, aluminum, zinc, antimony, silicon, tin, titanium, cadmium, indium, platinum, rhodium, iridium, uranium, nickel, ruthenium, technetium, manganese, cobalt, tantalum, niobium, osmium, vanadium, iron, chromium, rhenium, molybdenum, silver, tungsten, beryllium, boron, copper, and mercury.

8. The conductive paste of claim 1, wherein the element having the high oxidation potential comprises at least one selected from copper, titanium, ruthenium, cadmium, zinc, rhodium, potassium, sodium, nickel, bismuth, tin, barium, germanium, lithium, strontium, magnesium, beryllium, lead, calcium, molybdenum, tungsten, cobalt, indium, silicon, gallium, iron, zirconium, chromium, boron, manganese, aluminum, lanthanum, neodymium, niobium, vanadium, yttrium, and scandium.

9. The conductive paste of claim 1, wherein the conductive powder, the metallic glass, and the organic vehicle are included in an amount of about 30 to about 99 weight percent, about 0.1 to about 20 weight percent, and about 0.9 to about 69.9 weight percent based on a total weight of the conductive paste.

10. The conductive paste of claim 1, wherein the metallic glass is substantially amorphous.

11. The conductive paste of claim 1, wherein the metallic glass has a supercooled liquid region of about 5° C. to about 200° C.

12. The conductive paste of claim 1, wherein the metallic glass comprises copper and zirconium.

13. The conductive paste of claim 12, wherein the metallic glass further comprises at least one selected from aluminum, silver, nickel, titanium, iron, palladium, and hafnium.

14. The conductive paste of claim 13, wherein at least one selected from aluminum, silver, nickel, titanium, iron, palladium, and hafnium is comprised in an amount of about 10 atomic percent or less, based on a total amount of the metallic glass.

15. An electronic device comprising, an electrode formed using the conductive paste of claim 1.

16. The electronic device of claim 15, wherein the electrode has a contact resistance of about 1 kΩcm$^2$ or less.

17. The electronic device of claim 15, wherein the electrode has a resistivity of about 10 mΩcm or less.

18. A solar cell comprising
a semiconductor substrate, and
an electrode electrically connected with the semiconductor substrate and formed using the conductive paste of claim 1.

19. The solar cell of claim 18, wherein the electrode has a contact resistance of about 1 kΩcm$^2$ or less.

20. The solar cell of claim 18, wherein the electrode has a resistivity of about 10 mΩcm or less.

21. The solar cell of claim 18, wherein the electrode comprises a buffer layer positioned at a region which is adjacent to the semiconductor substrate, and an electrode portion which is positioned at a region except the buffer layer.

22. The conductive paste of claim 1, wherein the element having a high oxidation potential has an absolute value of a Gibbs free energy of oxide formation of about 100 kiloJoules per mole to about 2320 kiloJoules per mole.

23. The conductive paste of claim 1, wherein the alloy of the metallic glass includes two to six elements.

* * * * *

UNITED STATES PATENT AND TRADEMARK OFFICE
CERTIFICATE OF CORRECTION

Page 1 of 1

PATENT NO. : 8,668,847 B2
APPLICATION NO. : 13/208705
DATED : March 11, 2014
INVENTOR(S) : Se-Yun Kim et al.

It is certified that error appears in the above-identified patent and that said Letters Patent is hereby corrected as shown below:

On the title page insert:

item -- (63) Continuation-in-part of application No. 13/021,535, filed on Feb. 4, 2011, now abandoned. --

In the Specification

On column 1, lines 9-14 should be replaced with the following paragraph:

This application is a continuation-in-part of U.S. Application No. 13/021,535 (now abandoned), filed on February 4, 2011, which claims priority under 35 U.S.C. § 119 to Korean Patent Application No. 10-2010-0078344, filed on Aug. 13, 2010. This application also claims priority under 35 U.S.C. 119 to Korean Patent Application No. 10-2011-0066739, filed on Jul. 6, 2011. The entire content of each of the above-referenced applications is herein incorporated by reference.

Signed and Sealed this
Fourth Day of November, 2014

Michelle K. Lee
*Deputy Director of the United States Patent and Trademark Office*